United States Patent [19]

Lescourret

[11] Patent Number: 5,694,041

[45] Date of Patent: Dec. 2, 1997

[54] METHOD OF COMPENSATION OF ELECTROMAGNETIC PERTURBATIONS DUE TO MOVING MAGNETIC AND CONDUCTING OBJECTS

[75] Inventor: Jean-Louis Lescourret, Meriguec, France

[73] Assignee: Sextant Avionique, Meudon La Foret, France

[21] Appl. No.: 496,213

[22] Filed: Jun. 28, 1995

[30] Foreign Application Priority Data

Jul. 5, 1994 [FR] France ................... 94 08286

[51] Int. Cl.$^6$ .................. G01B 7/14; G01D 5/20; F41G 3/22; G06F 15/50
[52] U.S. Cl. ............... 324/207.12; 324/225; 364/571.01
[58] Field of Search ............... 324/207.12, 244, 324/260, 225, 247; 364/571.01, 571.02, 571.03, 571.04, 571.05, 571.06, 571.07, 571.08

[56] References Cited

U.S. PATENT DOCUMENTS

| | | | |
|---|---|---|---|
| 3,697,869 | 10/1972 | Greenberg et al. | 324/244 |
| 4,287,809 | 9/1981 | Egli et al. | 89/41 EA |
| 4,394,831 | 7/1983 | Egli et al. | 324/260 |
| 5,126,669 | 6/1992 | Honess et al. | 324/261 |

FOREIGN PATENT DOCUMENTS

| | | |
|---|---|---|
| 2 458 838 | 1/1981 | France . |
| 2 664 044 | 1/1992 | France . |

*Primary Examiner*—Walter E. Snow
*Attorney, Agent, or Firm*—Oblon, Spivak, McClelland, Maier & Neustadt, P.C.

[57] ABSTRACT

The disclosure relates to a method of compensation of perturbations of magnetic field measurements made by a sensor (C) caused by sources of perturbation ($S_1, S_2, S_3, \ldots S_k$) attached to the sensor. The method utilizes a first stage that expresses the perturbation caused by each of the sources, that are situated in any given ambient magnetic field, as an explicit function of the average magnetic field at the position of the source so as to build a model that can be used to calculate its perturbation at the center of the sensor, a second stage, said sensor being located in the magnetic field to be measured, to determine the perturbation caused by each of the sources of perturbation by using its model and knowing the average magnetic field at this position, a third stage that sums the perturbations of all the sources of perturbation, and a fourth stage that subtracts this sum from the measurement made by the sensor. The invention is applicable to systems requiring precise measurement of a magnetic field, notably in the case of the determination of the position and orientation of aircraft pilot helmet aiming devices.

9 Claims, 3 Drawing Sheets

METHOD OF COMPENSATION OF ELECTROMAGNETIC PERTURBATIONS DUE TO MOVING MAGNETIC AND CONDUCTING OBJECTS

BACKGROUND OF THE INVENTION

The invention relates to a method of compensation of electromagnetic perturbations due to moving magnetic and conducting objects. It is applicable notably to the determination of the position and orientation of a helmet aiming device. It is applicable, for example, to the compensation of errors in the measurement of the electromagnetic field when this is perturbed by magnetic and conducting parts attached to the system of measurement and moving in the electromagnetic field to be measured. Once the errors are compensated, it is then possible to know the real ambient field measured by the system of measurement and to deduce the required information, for example the position and orientation of a helmet aiming device.

More generally, the invention is applicable to all systems requiring very precise knowledge of the ambient electromagnetic field, this precision implying compensation of errors in the measurement caused by the environment. Consequently, the invention is also applicable, for example, to systems of detection of magnetic anomalies and to on-board aircraft navigation systems.

Known methods of compensation, designed for example for navigation systems or systems of detection of magnetic anomalies, consist in modelling the perturbations of the magnetic field by the sum of several components: a first, independent of the ambient field but which is a function of the history of the excitations to which the sources of magnetic perturbation have been subjected, a second, induced by the ambient field and dependent notably on the magnetic and geometric characteristics of these sources of perturbations and, finally, a third, due to the circulation of induced Foucault currents.

These methods are based notably on the general linear dependence of the set of perturbations and the ambient inducing field. A global model of the electromagnetic field is established at the center of the system of measurement. However, in the presence of several distinct sources of perturbation, this type of model proves to be inadequate. Moreover, in the case of navigation systems or detection of magnetic anomalies, the ambient magnetic field is assumed to be uniform when, in fact, this assumption is generally invalid, for example in the presence of multiple perturbations. The compensation of the measurement errors is therefore necessarily incomplete.

In the case of the determination of position and orientation of an aircraft pilot's helmet aiming device, part of the measurement system, called the sensor and comprising, for example, three coils, is mounted in the helmet. The other part of the measurement system, called the transmitter and comprising three other coils generating a magnetic field, is mounted in the cockpit, above the head of the pilot for example. A current is successively generated in each coil of the transmitter. These currents produce successively three magnetic fields that are detected by the coils of the sensor attached to the helmet. For each magnetic field generated, the three corresponding spatial components are detected by the coils of the sensor. The nine resulting components then enable determination of a transformation matrix between the trihedron constituted by the coils of the transmitter and the trihedron constituted by the coils of the sensor and therefore determination of the position and orientation of the sensor— and thus of the helmet.

In reality however, the measurements of field made at the position of the sensor are perturbed notably by magnetic and conducting objects located in the neighborhood of this sensor on the helmet of the pilot. These perturbing objects are for example cathode ray tubes screened by tubes of high magnetic permeability or conducting screening casings of electronic systems such as light intensifiers.

SUMMARY OF THE INVENTION

The goal of the invention is to determine a method of compensation of electromagnetic perturbations correcting as exactly as possible the measurement errors caused by moving magnetic and conducting objects in a non-homogeneous ambient magnetic field, in other words, a field that varies with the position in space.

For this purpose, the object of the invention is a method of compensation of perturbations of magnetic field measurements made by a sensor caused by sources of perturbation attached to the sensor, wherein it comprises a first stage that expresses the perturbation caused by each of said sources, that are situated in any given ambient magnetic field, as an explicit function of the average magnetic field at the position of the source so as to build a model that can be used to calculate its perturbation at the center of said sensor, a second stage, said sensor being located in the magnetic field to be measured, to determine the perturbation caused by each of said sources by using its model and knowing the average magnetic field at this position, a third stage that sums the perturbations of all said sources, and a fourth stage that subtracts this sum from the measurement made by said sensor.

The main advantages of the invention are that the errors can be compensated whatever the position and orientation of the perturbing objects in a non-homogeneous ambient magnetic field that is a function of the spatial coordinates, the radiation of the field being for example dipolar or multipolar or of an even more complex structure, that the determination of the effect of the perturbing objects can be made in a field different from the field used operationally, the effects being, in particular, identified in the factory using specific means, that it is adaptable to many types of applications, and that it is expensive.

BRIEF DESCRIPTION OF THE DRAWINGS

Figure 1:
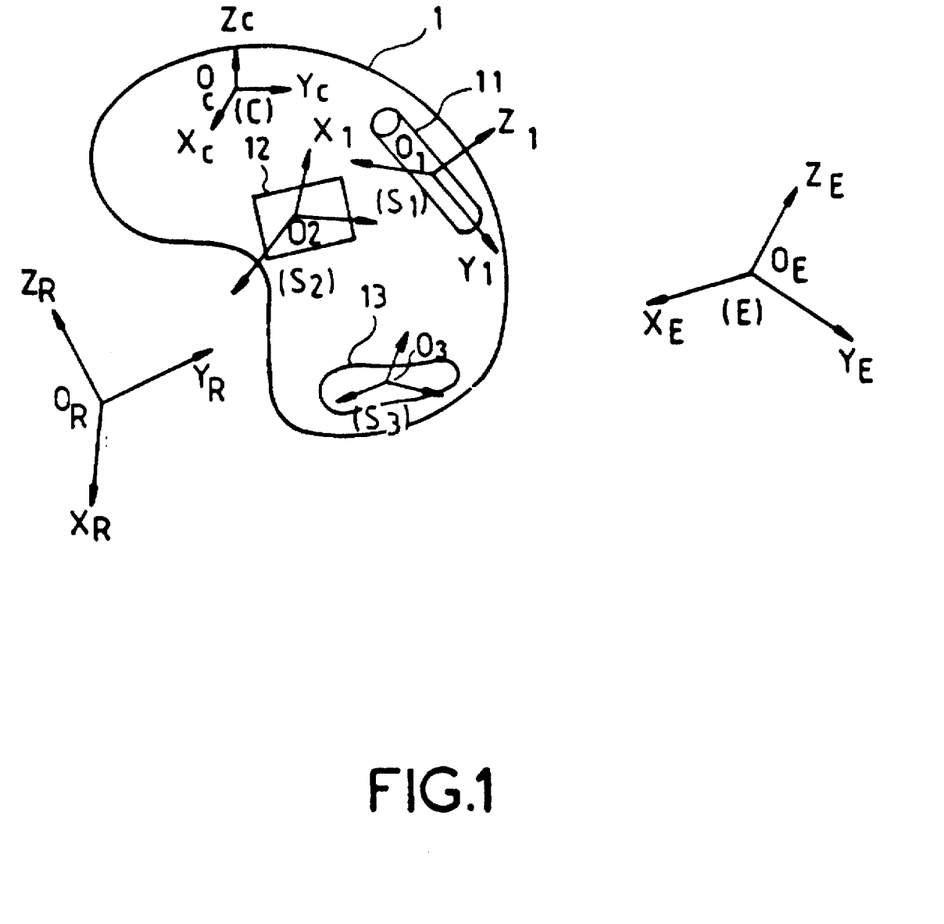
FIG. 1 shows a pilot's helmet fitted with a magnetic field sensor and with objects causing electromagnetic perturbations.

The invention will be better understood and other advantages and characteristics will become clear on reading the following description making reference to the appended figures, of which:

FIG. 1 illustrates the method according to the invention by means of the example of its application to the determination of the position and orientation of an aircraft pilot's helmet aiming device 1.

A sensor is represented by an orthonormal frame of reference C of origin $O_c$; the sensor is for example attached to the helmet 1. Sources of electromagnetic perturbations 11, 12, 13 are also attached to the helmet 1. As an example, they are limited to three. They are represented by orthonormal frames of reference $S_1, S_2, S_3, \ldots S_k$ of respective origins $O_1, O_2, O_3, \ldots O_k$ and having respective axes $X_1, Y_1, Z_1$, $X_2, Y_2, Z_2$ $X_3, Z_3, Z_3$ and $X_k, X_k, Z_k$, the orientations of these orthonormal axes being arbitrary. The origins $O_1, O_2, O_3 \ldots O_k$ of the frames of reference are for example the centers of the sources of perturbations 11, 12, 13. In the rest of this description, these sources be taken to coincide with these origins.

The orthonormal frame of reference C of the sensor is moving in a frame of reference Ref of origin $O_R$. The frames of reference $S_1, S_2, S_3$, and more generally the frames of reference $S_k$ (k>3), of the sources of perturbation are fixed relative to the frame of reference C of the sensor. An orthonormal frame of reference E of origin $O_E$, fixed in the frame of reference Ref, is linked for example to a transmitter of magnetic induction, used notably to enable the sensor attached to the helmet 1 to determine the position and orientation of this helmet as explained previously.

In a first stage of the method according to the invention, the sources of perturbation $S_1, S_2, S_3, \ldots S_k$ being situated in a given ambient magnetic field, the method according to the invention consists in expressing, for each source, the model of the perturbation of a source at the position of the sensor C as an explicit function of the average field, for example the average field at the origin $O_k$ of the frame of reference defining this source. This enables in particular a model of the source to be defined that is dependent explicitly on the field in which each source $S_k$ is situated, and consequently determination of the parameters of the model of the source outside its operational electromagnetic environment, these being independent of the ambient field.

In a second stage, the sensor C being situated in the magnetic field to be measured, the method according to the invention consists in determining the perturbation caused by each source $S_k$ by using its model and knowing the average magnetic field existing at its position. In a third stage, the sum of the perturbations due to the sources is computed. Finally, in a fourth stage, this sum is subtracted from the measurement made by the sensor C.

Using this method, the set of parameters of the model of the source that enables calculation of the perturbation phenomenon produced by this source, is independent of the field in which the sensor and the set of sources are situated. Therefore, in this example of an application, this set of parameters of the model is independent of the magnetic field in which the helmet is situated. In other words, the determination of the model can be performed in particular in a field different from the field used operationally by the pilot. The first phase of the method according to the invention can therefore be implemented, for example, in the factory, outside the operational environment (i.e. outside the aircraft cockpit). In the application to a helmet aiming device, in particular, the models of the perturbing sources can be determined in the factory using specific means, such as a radiating quasi-dipolar transmitter, for example, and can then be used in the aircraft cockpit in any electromagnetic field in a frequency band containing the oscillation frequency produced by the transmitter E mounted in the cockpit.

According to the invention, a representative model can be built by assuming that the source, in particular if it is a conducting object, can be represented by one or more elementary current loops.

The following description, making reference to the figures, explains an embodiment of the invention taken as an example, which is applicable to the determination of the position and orientation of a helmet aiming device.

In free space, for example, the magnetic field measured by the sensor C is the sum of the field generated by the transmitter E and the fields produced by the sources $S_k$ of the helmet. This measured magnetic field can be expressed by the following relation:

$$B_c(O_c) = (R_{C/E})^t B_E(O_c) + \sum_{k=1}^{NS} R'_{c/S_k} f_k(B_k(O_k)) s_k \quad (1)$$

where:

$B_c(O_c)$ is the total measured field at the center $O_c$ of the sensor expressed in the frame of reference C of the sensor;

$B_E(O_c)$ is the ambient field at the center $O_c$ of the sensor, produced for example by the transmitter and expressed in the frame of reference E of the transmitter, this field $B_E(O_c)$ being the field to be measured;

$(R_{c/E})^t$ is the transposed matrix of the transformation matrix between the frame of reference E of the transmitter and the frame of reference C of the sensor. $R_{c/E}$ is given by:

$(R_{c/Ref})_E (R_{E/Ref})^t{}_E = (R_{E/Ref})^t{}_{Ref} (R_{c/Ref})_{Ref}$ where $R_{c/Ref}$ is the transformation matrix between the frame of reference Ref and the frame of reference C of the sensor (expressed in the frame of reference E it is written $(R_{c/Ref})_E$ or in the frame of reference Ref it is written $(R_{c/Ref})_{Ref}$);

$(R_{c/e})^t B_E(O_c) = R^t{}_{e/Ref} [B_E(O_c)]_{Ref}$;

$[B_E(O_c)]_{Ref}$ is the ambient field expressed in the frame of reference Ref;

$B_k(O_k)$ is the average magnetic field at the center $O_k$, expressed for example in the frame of reference $S_k$;

the function $f_k$ represents the relation between the ambient field at the point $O_k$ and the perturbing field at the point $O_c$ produced by the source k and expressed in the frame of reference $(S_k)$.

$R_{c/S_k}$ is the transformation matrix between the frame of reference $S_k$ of the source $S_k$ and the frame of reference C of the sensor;

NS is the number of perturbing sources.

Figure 2:
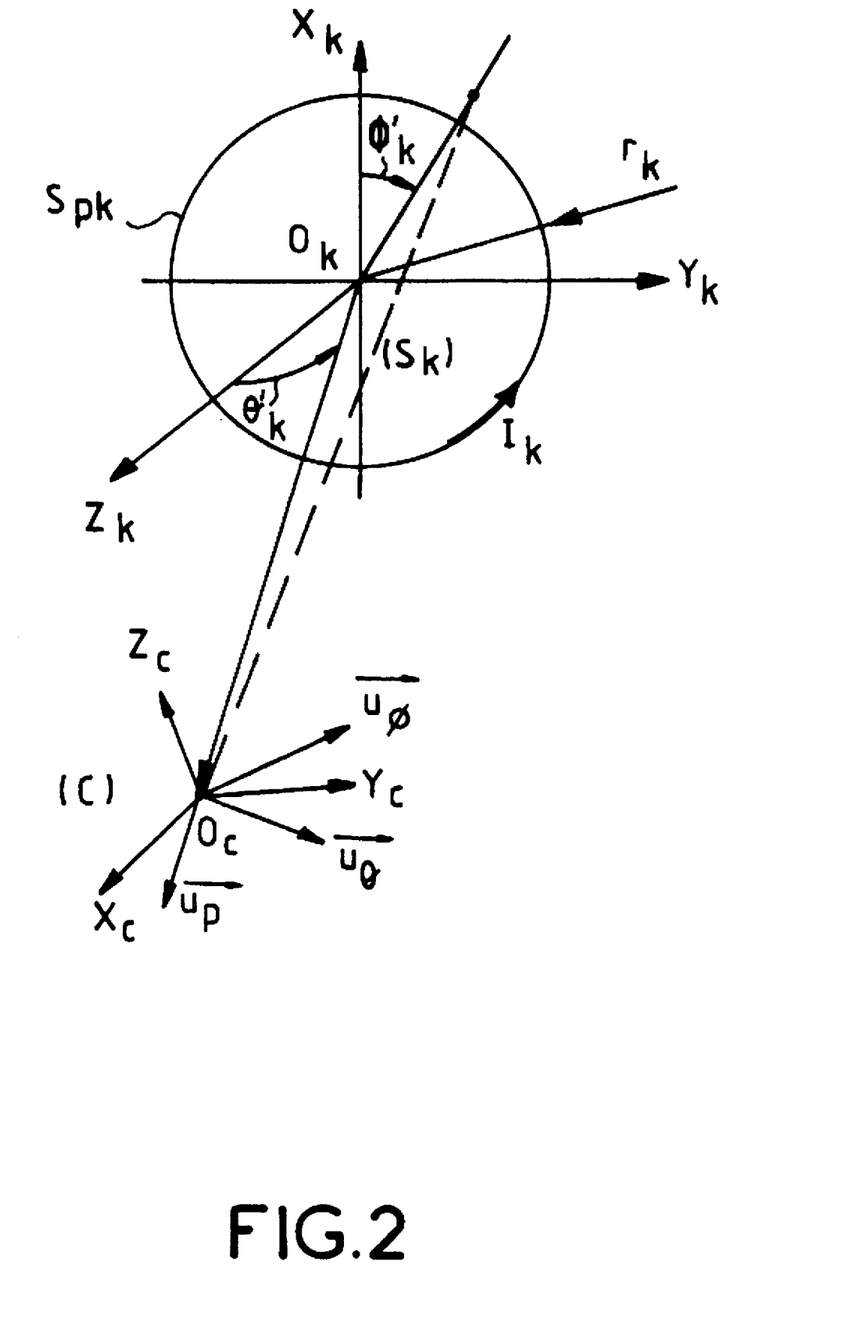
FIG. 2 shows a possible modelling of one of these sources of electromagnetic perturbation.

FIG. 2 illustrates a possible example of the representative model of the perturbation of a source $S_k$. This model is composed of an elementary loop or turn $SP_k$ whose radius is $r_k$ and whose center is $O_k$, the origin of the orthonormal frame of reference $S_k$ of the source. We assume that the average magnetic field $B_k(O_k)$ at the center of the loop $SP_k$ is substantially constant over a sphere of radius $r_k$. The average field is therefore assumed to be substantially uniform within the loop.

This average field can vary with time. When it varies, it induces in the loop a current $i_k$ proportional to the rate of change according to Lenz's Law. This current generates in turn a magnetic field according to the known laws of electromagnetism.

If we consider initially a loop of very small size, the induced current $i_k$ in the elementary loop situated in the average field $B_k(O_k)$ is given by:

$$R_k i_k + L_k \frac{d}{dt} i_k = -\frac{d\phi_k}{dt} \quad (2)$$

where $R_k$ and $L_k$ are respectively the ohmic resistance and the self-inductance of the loop $SP_k$, and $\phi_k$ is the magnetic flux crossing the loop.

For a magnetic field $B_k(O_k)$ at the position of the loop that varies sinusoidally with time at angular frequency $\omega$, we obtain:

$$i_k[R_k + j L_k \omega] = -j A_k \omega (\bar{B}_k(O_k) \cdot \bar{n}_k) \quad (3)$$

where $A_k$ is the area of the loop $\vec{n}_k$ is the vector normal to the loop;

$\overline{B}_k(O_k).\vec{n}_k$ is the scalar product of the ambient magnetic field vector at the center of the loop and the vector $\vec{n}_k$.

Transforming the relation (3), we obtain:

$$i_k = -j \frac{A_k \omega}{R_k + jL_k\omega} \overline{B}_k(O_k) \cdot \vec{n}_k \qquad (4)$$

Denoting by I the modulus of the alternating current $i_k$, we obtain:

$$I = |i_k| |\alpha| |\overline{B}_k(O_k).n_k| = |\alpha| |B_k(O_k)|.\text{Cos}(\overline{B}_k(O_k).\vec{n}_k) \qquad (5)$$

where:

$$\alpha = -j \frac{A_k \omega}{R_k + jL_k\omega} \qquad (6)$$

Now considering a radial coordinate system $\overline{u}_p$, $\overline{u}_\theta$, $\overline{u}_\phi$ centered on the point $O_c$, the center of the sensor (FIG. 2), where:

$$\vec{u}_\rho = \frac{\overrightarrow{O_k O_c}}{|\overrightarrow{O_k O_c}|},$$

in which $\overline{u}_\theta$ and $\overline{u}_\phi$ are two other unitary vectors such that $\overline{u}_\rho$, $\overline{u}_\theta$, $\overline{u}_\phi$ form a direct orthonormal frame of reference $(u_k)$ with $\overline{u}_\theta$ in the plane $(\overline{u}_\rho, \vec{n}_k)$, the vector field $(\overline{B}_{Pk})_{uk}$ created by the loop $SP_k$ is expressed in the radial coordinate system up, $\overline{u}_\rho, \overline{u}_\theta, \overline{u}_\phi$ by three components, a component $B_\rho$ along the axis $\overline{u}_\rho$, a component $B_\theta$ along the axis $\overline{u}_\theta$ and a component $B_\phi$ along the axis $\overline{u}_\phi$. This field $(\overline{B}_{Pk})_{uk}$ models the perturbation of the source k.

Known laws of electromagnetism show that for $|O_k O_c| > r_k$; the components $B_\rho$, $B_\theta$ and $B_\phi$ are given by the following relations:

$$\begin{cases} B_\rho = I \left[ \frac{\mu_o}{4\pi} \frac{2\pi r_k^2}{\pi} \sum_{l=0}^{\infty} (-1)^l \frac{(2l+1)!!}{2^l(l!)} \frac{r_k^{2l}}{\rho^{2l+2}} P_{2l+1}(\text{Cos }\theta'_k) \right] & (7) \\ B_\theta = -I \left[ \frac{\mu_o}{4\pi} \pi r_k^2 \sum_{l=0}^{\infty} (-1)^l \frac{(2l+1)!!}{2l(l+1)!} \frac{1}{\rho^3} \left(\frac{r_k}{\rho}\right)^{2l} P_{2l+1}^1(\text{Cos }\theta'_k) \right] & (8) \\ B_\phi = 0 & (9) \end{cases}$$

where:

$\rho = |O_k O_c|$ $I = |i_k|$ $\theta'_k = (\vec{n}_k, \overline{u}_\rho), \vec{n}_k = \overrightarrow{O_k Z_k}$ (FIG. 2);

$P_l^m(x)$ is a Legendre polynomial of order l,m $(k)!! = k(k-2)(k-4)x \ldots 5x3x1$ (k is odd).

The expressions for $\rho < r_k$ are not given since they do not modify the final model; in any case, in reality $\rho > r_k$.

The expression of the field $(\overline{B}_{Pk})_c$ of the source $S_k$ or of the loop $SP_k$, expressed in the frame of reference C of the sensor, is given by the following relation:

$$(B_{Pk})_c = (R_{uk/c})(B_{Pk})_{uk} \qquad (10)$$

where $R_{uk/c}$ is the transformation matrix between the previously defined flames of reference C of the sensor and $u_k = \overline{u}_\rho, \overline{u}_\theta, \overline{u}_\phi$.

More generally, if we consider a system of three loops rotationally symmetric about their normals $\vec{n}_x, \vec{n}_y, \vec{n}_z$, defining for example the frame of reference $(S_k)$, the resultant field at the position of the sensor $O_c$ is the sum of the three field produced by the loops above.

In the radial coordinate system $(u_k)$, the field due to the source k is:

$$(\overline{B}_{Pk}(O_c))_{uk} = [\overline{B}_{Pk}^1 + \overline{B}_{Pk}^2 + \overline{B}_{Pk}^3]_{uk} \qquad (11)$$

where $\overline{B}_{Pk}^{1,2,3}$ are given by the equations (7), (8), (9).

To start, to simplify the description we will suppose that:

$$\overrightarrow{\rho_k} = |O_c O_k| \gg r_x, r_y, r_z$$

where $r_x, r_y, r_z$ are the radii of the loops.

Making these assumptions, the equations (7), (8), (9) above for $B_{Pk}^{1,2,3}$ are simplified and can be written in a manner known to professionals of the art:

$$(B_{Pk}(O_c))u_k = \frac{1}{\rho_k^3} \begin{bmatrix} 3 & 0 & 0 \\ 0 & -1 & 0 \\ 0 & 0 & -1 \end{bmatrix} P^t [S_x I_x \vec{n}_x + S_y I_y \vec{n}_y + S_z I_z \vec{n}_z] \qquad (12)$$

where:

$P = [\overline{u}_\rho, \overline{u}_\theta, \overline{u}_\phi]$ is the transformation matrix between the frame of reference $(S_k)$ and the radial coordinate system $(u_k)$;

$S_x = \pi r_x^2$, $S_y = \pi r_y^2$, $S_z = \pi r_z^2$;

$I_x, I_y, I_z$ are the currents I of the coils of axes $\vec{n}_x, \vec{n}_y, \vec{n}_z$;

$S_x I_x, S_y I_y, S_z I_z$ are respectively the magnetic moments of axes $\vec{n}_x, \vec{n}_x, \vec{n}_z$.

This matrix P is constant for the source k since it depends only on $$\overrightarrow{O_c O_k},$$

which is fixed in the frame of reference (C) of the sensor or the frame of reference $(S_k)$ of the source.

In (12), the currents $I_x, I_y, I_z$ are defined by the equation (5):

$$\begin{cases} I_x = |\alpha_x| |\overline{B}_k(O_k)| \text{Cos}(\theta_x)_{Sk} \\ I_y = |\alpha_y| |\overline{B}_k(O_k)| \text{Cos}(\theta_y)_{Sk} \\ I_z = |\alpha_z| |\overline{B}_k(O_k)| \text{Cos}(\theta_z)_{Sk} \end{cases} \qquad (13)$$

Figure 3:
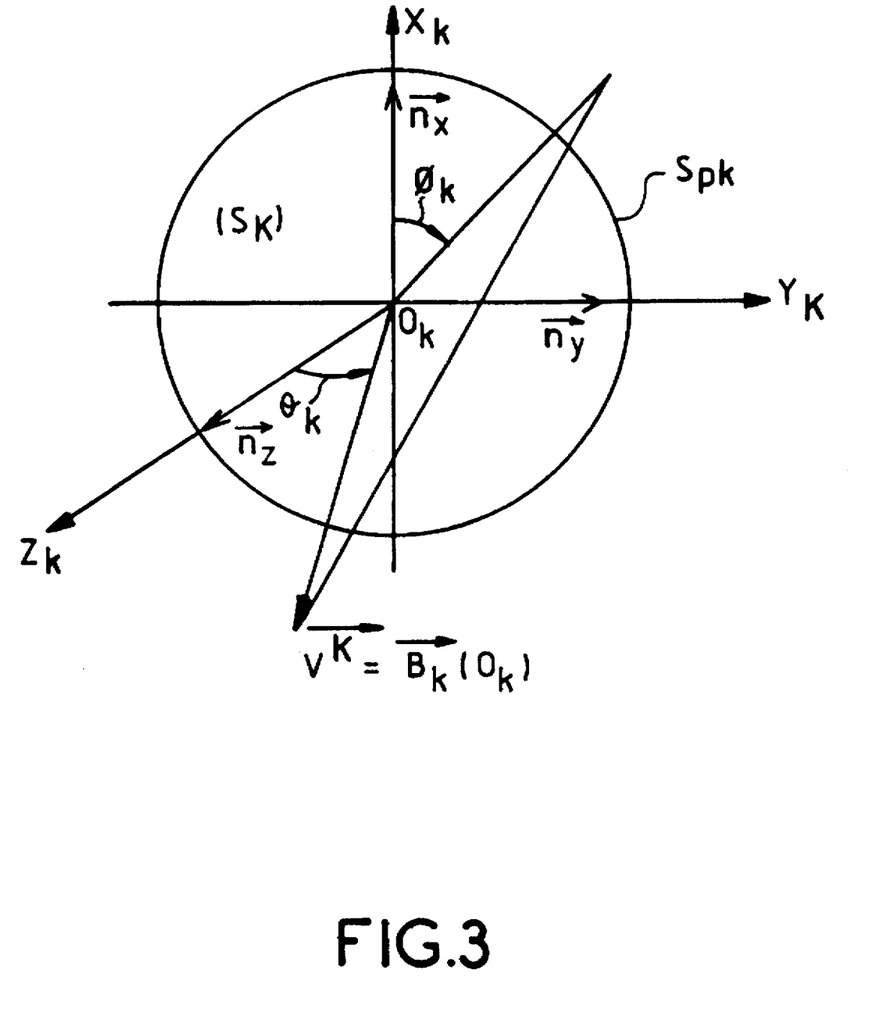
FIG. 3 is a representation of an electromagnetic perturbation caused by the source mentioned previously.

As illustrated by FIG. 3, the vector $\overline{B}_k(O_k) = \overline{V}_k$ is defined in the frame of reference $(S_k)$ by two angles $\phi_k$ and $\theta_k$, where $\phi_k$ represents the projection of the vector $\overline{V}_k$ of the magnetic field in the plane $O_k X_k Y_k$ and $\theta_k$ is the angle made by vector $\overline{V}_k$ with respect to $Z_k (= \vec{n}_z)$.

We shall use the following conventions:

$$Cos(\theta_z)_{Sk} = Cos\,\theta_k$$

$$Cos(\theta_y)_{Sk} = Sin\,\theta_k\,Sin\,\phi_k$$

$$Cos(\theta_x)_{Sk} = Sin\,\theta_k\,Cos\,\phi_k \qquad (14)$$

Substituting (13) and (14) in (12), the perturbing field $(B_{Pk}(O_c))_c$ at the point $O_c$, origin of the frame of reference C of the sensor, expressed in this frame of reference C, is given by the following relation based on equation (10):

$$(B_{Pk}(O_C))_C = |B_k(O_k)|R_{uh/C} \begin{bmatrix} Sin\theta_k(a_x Cos\phi_k + b_x Sin\theta_k) + c_x Cos\theta_k \\ Sin\theta_k(a_y Cos\phi_k + b_y Sin\theta_k) + c_y Cos\theta_k \\ Sin\theta_k(a_z Cos\phi_k + b_z Sin\theta_k) + c_z Cos\theta_k \end{bmatrix}$$

where:

$\overline{B}_k$ is the ambient field at the point $O_k$;

$a_x, a_y, a_z, b_x, b_y, b_z, c_x, c_y, c_z$ are the coefficients of the matrix:

$$\frac{1}{\rho_k^3} \begin{bmatrix} 3 & 0 & 0 \\ 0 & -1 & 0 \\ 0 & 0 & -1 \end{bmatrix} [P^1] \begin{bmatrix} I\alpha_x IS_x & 0 & 0 \\ 0 & I\alpha_y IS_y & 0 \\ 0 & 0 & I\alpha_z IS_z \end{bmatrix} \begin{bmatrix} a_x & b_x & c_x \\ a_y & b_y & c_y \\ a_z & b_z & c_z \end{bmatrix}$$

If the assumption $\rho k \gg \{r_x, r_y, r_z\}$ is not valid, the matrix $$\begin{bmatrix} 3 & 0 & 0 \\ 0 & -1 & 0 \\ 0 & 0 & -1 \end{bmatrix}$$

depends on $\rho k$ and $\theta'_k$ and, defining the coordinates of $$\overrightarrow{O_cO_k},$$

according to the equations (7), (8), (9) known to professionals of the art.

Whatever the case may be, this matrix remains constant for the source $S_k$. Therefore the simplifying assumption does not at all change the equation (15) for the perturbing field.

The expression of the field $\overline{B}_{Pk}(O_c)$ in the frame of reference of the sensor is of the same type as that expressed in the frame of reference $(u_k)$; only the coefficients $a_x, a_y, a_z, b_x, b_y, b_z, c_x, c_y, c_z$ would be modified in the model.

As these are unknown coefficients that must be determined, this has no impact on the method. The coefficients are identified in the frame of reference of the sensor (C), for example.

The equation (15) shows in fact that each component of the model of the perturbation, the vector field $B_{Pk}$, can be written as the expansion limited to 1st order of the real and imaginary parts of the associated complex Legendre function defined by:

$$Z_{l,m}(\theta,\phi) = \sum_{l=1}^{L} \sum_{m=o}^{l} \sqrt{\frac{2l+1}{4\pi}} \frac{(l-m)!}{(l+m)!} P_l^m(Cos\,\theta)e^{jm\phi} \qquad (16)$$

where:

$$e^{jm\phi} = Cos\,m\phi + j\,Sin\,m\phi$$

$$P_l^m(x) = \frac{(-1)^m(1-x^2)^{m/2}}{2^l l!} \frac{d^{l+m}}{dx^{l+m}}(x^2-1)^l \qquad (17)$$

At 1st order L=1, m=0 and l=1.

More generally, the calculations and experiments made by the Applicant show that is possible to adopt the following definition for each component of the vector field $B_{Pk}$, model of the source $S_k$, expressed in the frame of reference C of the sensor:

$$(B_{Pk}(O_C))_i = |\overline{V}_k| \sum_{l=1}^{L_k} \sum_{m=o}^{l} P_l^m(Cos\,\theta_k)[A_{l,m,i}^k Cos(m\phi_k) + C_{l,m,i}^k Sin(m\phi_k)] \qquad (18)$$

In this equation, $\theta_k$ is the angle made by $\overrightarrow{V}_k$ with the axis $\overrightarrow{O_z}$ of the sensor, and $\phi_k$ is the projection of $\overrightarrow{V}_k$ relative to $$\overrightarrow{O_cX_c}$$

in the plane $O_c\,X_c\,Z_c$ of this same sensor (FIG. 3).

$L_k$ is the order of expansion of the Legendre polynomial relative to the source k.

This new definition does not at all change the previous assumptions since the frame of reference $(S_k)$ was assumed to be arbitrary. In this case we can consider it to coincide with the frame of reference of the sensor (C).

In (18) $(B_{Pk}(O_c))_i$ is the ith component of the vector $(B_{Pk}(O_c))$ (i=1,2,3); the component is produced by three modelling loops of the source $S_k$; $A_{l,m,i}^k$ and $C_{l,m,i}^k$ are constants to be determined for the source k.

This model (18) takes into account the fact that the model based on 3 thin loops (15) is a simplification of the physical reality. In fact, we should really speak of pseudo-loops corresponding to the lines of current circulating in the conducting elements.

Having established the model (18) of the perturbation, we observe that it depends in particular and explicitly on $\overline{B}_k(O_k)$, the external field at the point $O_k$ at the center of the source k. This source is assumed to be known:

during the establishment of the model, it is the field $B_E$ transmitted in free space by the transmitter;

during use in any ambient field, for example in the cockpit of an aircraft, it is the field generated by the transmitter $B_E$ to which is possibly added the perturbing field present in the cockpit.

In the first phase of the method according to the invention, which involves determining the unknown coefficients of the model (18), the ambient field $B_E$ generated by the transmitter is known by means, for example, of the method described in the French patent n°90.08230: according to this method, the measurement of the field $\overline{B}_c(O_c)$ resulting from the transmission by each of the three coils provides a value very close to the position of the center of the sensor $(X_c, Y_c, Z_c)$ in the frame of reference (E) of the transmitter or the frame of reference Ref when the helmet is subjected to rotations and translations.

Given an estimation of $X_c, Y_c, Z_c$, we deduce the value of the ambient field $\overline{B}_E$ at the center of the sensor.

We then express the field $\overrightarrow{V}_k = \overline{B}_k(\overline{O}_k)$ as a function of the coordinates of $O_k$ in the frame of reference:

$$\overrightarrow{O_RO_k} = \overrightarrow{O_RO_c} + \overrightarrow{O_cO_k}$$

where:

$$(\overrightarrow{O_cO_k}) = R_{d/Ref} \cdot (\overrightarrow{O_cO_k})_c = ROT \cdot (\overline{\rho})_c$$

$(\overline{\rho})_c$ is constant in the frame of reference of the sensor or in the frame of reference $(S_k)$;

ROT is the rotation of the helmet equal to $R_{c/Ref}$ transformation matrix between the frame of reference Ref and the frame of reference of the sensor (C).

In the determination phase of the model, ROT is known, so we can deduce the coordinates of the source k in the frame of reference (Ref) as a function of the coordinates $\overline{X}'_k$ of the source in the frame of reference of the sensor, which are unknown and must be determined during this first stage of the method according to the invention.

The coordinates of the source k in the frame of reference are expressed by:

$$\overline{X}_k = \overline{X}_c + ROT.(\overline{\rho})_c$$

$$\overline{X}_k = \overline{X}_c + ROT.(\overline{X}'_k)$$

In the determination phase, ROT is the known rotation of the helmet ($\overline{X}_c$), the coordinates of the center of the sensor in the frame of reference, are known for example approximately by applying the method described in the French patent n°90.08230. We wish to identify 3 components of $\overline{X}'_k = (\overline{\rho})_c$. We deduce $(\overline{B}_k(O_k))_c = ROT^{-1}.[B_E(\overline{X}_k)]_{Ref}$ that is substituted in the equation (18).

After several iterations on $\overline{X}'_k$ and on $A_{l,m,i}{}^k$ and $C_{l,m,i}{}^k$ the estimation of $\overline{X}_k$ becomes better and the values of the parameters of the model, i.e. the components $(X_c)_{1,2,3}$ of the vector $\overline{X}_c$ and $A_{l,m,i}{}^k$ and $C_{l,m,i}{}^k$ converge on their true values.

Convergence is attained when the total field measured by the sensor and the modelled field are substantially the same at all point in space, in other words, when $(\overline{X}'_k)_i$, $A_{l,m,i}{}^k$ and $C_{l,m,i}{}^k$ minimize the mean quadratic deviation between the measurement and the field modelled according to s (1) and (18).

In the case of the application to the helmet aiming device, experience shows that for a cathode-ray tube of ½ or 1 inches, the model defined by the relation (15) is sufficient. For conducting objects of any shape, the expansion to third order of the Legendre polynomials ($L_k=3$) in the relation (18) gives of very good results.

Still in the framework of the applications to the helmet aiming device, this model must be re-determined for each field $B_E$ generated by each coil of the transmitter, of which there are three, for example. These fields may or may not be generated sequentially. They are for example linearly independent, which is the case notably if the transmission coils are quasi-orthogonal.

In the case of a transmitter with three coils, there are therefore 9 terms of the type (18) to be defined, three spatial components of the vector $B_k$ being defined for the three transmission coils. This is to be carried out for all the sources of perturbation, k ranging from 1 to NS, NS being the total number of these sources.

Thus, for the determination of the model of each source $S_k$, we must identify in fact the coefficients $A_{l,m,i}{}^k$ and $C_{l,m,i}{}^k$ of the relation (18) for the three transmission coils and the coordinates $(X'_k)_i$ of the center $O_k$ of the source $S_k$. In the case of application to a helmet aiming device, the coefficients $A_{l,m,i}{}^k$, $C_{l,m,i}{}^k$ and $(X'_k)_i$ are for example the parameters representative of the helmet and of the source $S_k$ for this given helmet. It is possible for example to place the support attaching rigidly the sensor C and the source of perturbation $S_k$ (i.e. the helmet) in the field of the transmission coils and carry out translations and rotations of the helmet. If we know in advance the field generated by the coils, or its model, it is possible for example to measure by difference the perturbation and to determine the parameters $(X'_k)_i$, $A_{l,m,i}{}^k$ and $C_{l,m,i}{}^k$ by a classical iterative method that minimize the mean quadratic deviation between the measurement and the previously known field or its model. This operation, which forms part of the first stage of the method according to the invention, can be carried out definitively in the factory for example. The parameters $(X'_k)_i$, $A_{l,m,i}{}^k$ and $C_{l,m,i}{}^k$ are for example memorized in a circuit built into the helmet; this circuit could be notably a memory of PROM, EPROM, or EEPROM type. The identification of these parameters $A_{l,m,i}{}^k$, $C_{l,m,i}{}^k$ and $(X'_k)_i$ and their memorization in the helmet makes them easily interchangeable. This provides in particular improved rapidity in changing helmets, and also certain cost advantages.

In the phase of operational use, the pilot wears for example the helmet which is situated in the ambient field of the cockpit. The method described in the French patent n°90.08230 enables approximate calculation of the position $\overline{X}_c$ and the orientation ROT of the helmet.

We deduce the perturbing fields of each source; their sum is subtracted from the measurement. The calculation of $\overline{X}_c$ and ROT is then repeated, which enables better precision to be obtained.

The method for compensation of electromagnetic perturbations according to the invention has been described by means of a typical application requiring a high degree of precision of measurement with a view to determining the position and orientation of an aircraft pilot's helmet aiming system. However, it will be clear to professionals of the art that the method can be applied to many other problems requiring in particular a high level of precision of measurement of electromagnetic fields.

What is claimed is:

1. Method of compensation of perturbations of magnetic field measurements made by a sensor (C) caused by sources of perturbation ($S_1, S_2, S_3, \ldots S_k$) attached to the sensor, wherein it comprises a first stage that expresses the perturbation caused by each of said sources, that are situated in a given ambient magnetic field, as an explicit function of the average magnetic field at the position of the source so as to build a model that can be used to calculate its perturbation at the center of said sensor, a second stage, said sensor being located in a magnetic field to be measured, to determine the perturbation caused by each of said sources of perturbation by using its model and knowing the average magnetic field at this position, a third stage that sums the perturbations of all said sources of perturbation, and a fourth stage that subtracts this sum from the measurements made by said sensor.

2. Method according to claim 1, wherein each source ($S_k$) is modelled by at least one loop ($S_{pK}$), the variations of the ambient field ($B_k$) at the position of the loop creating a current ($i_k$) in the loop, which produces a perturbing field.

3. Method according to claim 2, wherein the perturbation caused by each source ($S_k$) is modelled by a vector magnetic field ($\overline{B}_{Pk}(O_c)$) at the position of said sensor (C), this field being expressed as follows for each component:

$$(B_{Pk}(O_c))_\lambda = |\overline{B}_k(O_k)| \sum_{l=1}^{L_k} \sum_{m=0}^{l} P_l^m(\cos\theta_k)[A_{l,m,i}^l \cos(m\phi_k) + C_{l,m,i}^l \cdot \sin(m\phi_k)]$$

where:

$(B_{Pk}(O_C))_i$ is the ith component of the vector at the position of the sensor (C) and produced by at least one modelling loop of the source $(S_k)$, i=1, 2, 3 . . . ;

$(\overline{B}_k(O_k))$ is the value of the average ambient magnetic field at the center $O_k$ of the source $(S_k)$ and $|\overline{B}_k(O_k)|$ is its modulus;

$\theta_k$ is the angle between an axis of the frame of reference of the sensor (C) and the vector magnetic field $B_k(O_k)$ at the center $O_k$ of the loop;

$\phi_k$ is the angle between an axis of the frame of reference of the sensor and the projection of the previously mentioned vector magnetic field $B_k(O_k)$ on the plane passing through the center $O_c$ of the frame of reference of the sensor and containing the axes and $(O_c,X_c,Y_c,Z_c)$ being the frame of reference of the ) sensor;

$P_l^m(x)$ is a Legendre polynomial of order l,m defined by:

$$Pl^m(x) = \frac{(-1)^m(1-x^2)^{m/2}}{2^l l!} \frac{d^{l+m}}{dx^{l+m}}(x^2-1)^l;$$

$A_{l,m,i}{}^k$ and $C_{l,m,i}{}^k$ are constants.

4. Method according to claim 3, wherein the source $(S_k)$ is modelled by three loops.

5. Method according to claim 3, wherein in order to determine the constants $A_{l,m,i}{}^k$ and $C_{l,m,i}{}^k$ and the coordinates, $(X'_k)_{1,2,3}$ of the source (k), the sensor (C) and the sources $(S_k)$ are displaced by translation and rotation in a known ambient field, the constants $A_{l,m,k}{}^k$, $C_{l,m,i}{}^k$ and $(X'_k)_{1,2,3}$ being identified by an iterative method in order that these constants minimize the mean quadratic deviation between the compensated measurement and the known field.

6. Method according to claim 1, applicable to the determination of the position and orientation of an aircraft pilot's helmet aiming device, a transmitter fixed relative to the cockpit of the aircraft being composed of three coils each generating a magnetic field, the sensor (C), attached to the helmet, being composed of the same number of coils, the measurements by the sensor of the field produced by the transmitter enabling the position and orientation of the sensor to be defined in the space of the cockpit, the perturbations caused by the sources $(S_1,S_2,S_3, \ldots S_k)$ mounted on the helmet being compensated.

7. Method according to claim 6, wherein the constants $A_{l,m,i}{}^k$ and $C_{l,m,i}{}^k$ are determined independently for the field produced by each of said coils of the transmitter.

8. Method according to claim 5, wherein the constants $A_{l,m,k}{}^k$, $C_{l,m,i}{}^k$ and $(X'_k)_{1,2,3}$ of the model of the sources of perturbation $(S_1,S_2,S_3, \ldots ,S_k)$ attached to the helmet are determined in the factory, the helmet being placed in any given field.

9. Method according to claim 5, wherein the constants $A_{l,m,i}{}^k$, $C_{l,m,i}{}^k$ and $(X'_k)_{1,2,3}$ of the model are memorized in memorization circuits fitted in the helmet.

\* \* \* \* \*

UNITED STATES PATENT AND TRADEMARK OFFICE
CERTIFICATE OF CORRECTION

PATENT NO. : 5,694,041
DATED : December 2, 1997
INVENTOR(S) : Jean-Louis LESCOURRET et al.

It is certified that error appears in the above-identified patent and that said Letters Patent is hereby corrected as shown below:

On the title page, Item [54], and Column 1, lines 1-4, should read

-- METHOD OF COMPENSATION OF ELECTROMAGNETIC PERTURBATIONS OF MAGNETIC FIELD MEASUREMENTS MADE BY SENSOR DUE TO MOVING AND CONDUCTING OBJECTS --

Signed and Sealed this

Third Day of February, 1998

Attest:

BRUCE LEHMAN

*Attesting Officer*    *Commissioner of Patents and Trademarks*